United States Patent
Yue et al.

(10) Patent No.: US 9,543,432 B2
(45) Date of Patent: Jan. 10, 2017

(54) HIGH VOLTAGE LDMOS DEVICE WITH AN INCREASED VOLTAGE AT SOURCE (HIGH SIDE) AND A FABRICATING METHOD THEREOF

(71) Applicant: SHANGHAI HUAHONG GRACE SEMICONDUCTOR MANUFACTURING CORPORATION, Shanghai (CN)

(72) Inventors: Wei Yue, Shanghai (CN); Junjun Xing, Shanghai (CN); Wenqing Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/982,682

(22) Filed: Dec. 29, 2015

(65) Prior Publication Data
US 2016/0240660 A1    Aug. 18, 2016

(30) Foreign Application Priority Data
Feb. 15, 2015    (CN) .......................... 2015 1 0080741

(51) Int. Cl.
*H01L 29/00*    (2006.01)
*H01L 29/78*    (2006.01)
(Continued)

(52) U.S. Cl.
CPC ......... *H01L 29/7823* (2013.01); *H01L 21/265* (2013.01); *H01L 21/324* (2013.01);
(Continued)

(58) Field of Classification Search
CPC .......... H01L 29/7835; H01L 29/66659; H01L 29/1095; H01L 29/66681; H01L 29/7816
See application file for complete search history.

(56) References Cited

U.S. PATENT DOCUMENTS 4,311,532 A * 1/1982 Taylor ..................... H01L 21/74
148/DIG. 151
5,087,579 A * 2/1992 Tomassetti .......... H01L 27/0623
257/E27.015
(Continued)

FOREIGN PATENT DOCUMENTS

CN    101123192 A    2/2008
CN    101383375 A    3/2009
(Continued)

*Primary Examiner* — Ngan Ngo
(74) *Attorney, Agent, or Firm* — MKG, LLC

(57) ABSTRACT

A high voltage LDMOS device having high side source voltage, an n type buried layer and a p type buried layer situated on the interface between a p type substrate and an n type epitaxial layer; a lateral surface of the n type buried layer and a lateral surface of the p type buried layer not in contact, and are distant from one another with a distance, thereby increasing the withstand voltage between the n type buried layer and the p type buried layer; the p type buried layer and the drain overlap at least partially in a vertical direction, enabling the p type buried layer to exert a reduced surface field action on the drain, to increase the withstand voltage of the drain against the source; the source and the body terminal centrally on top of the n type buried layer.

9 Claims, 4 Drawing Sheets

(51) Int. Cl.
  *H01L 29/06*   (2006.01)
  *H01L 29/10*   (2006.01)
  *H01L 21/265*  (2006.01)
  *H01L 21/324*  (2006.01)
  *H01L 29/66*   (2006.01)

(52) U.S. Cl.
  CPC ........ *H01L 29/063* (2013.01); *H01L 29/0623* (2013.01); *H01L 29/1083* (2013.01); *H01L 29/1095* (2013.01); *H01L 29/66659* (2013.01); *H01L 29/66681* (2013.01); *H01L 29/7816* (2013.01); *H01L 29/7835* (2013.01)

(56) References Cited

U.S. PATENT DOCUMENTS

| | | | |
|---|---|---|---|
| 5,179,036 A * | 1/1993 | Matsumoto | H01L 21/8249 257/370 |
| 5,580,816 A * | 12/1996 | Hemmenway | H01L 21/76216 257/E21.545 |
| 6,236,084 B1 * | 5/2001 | Harada | H01L 21/823807 257/338 |
| 6,426,258 B1 | 7/2002 | Harada et al. | |
| 6,599,782 B1 | 7/2003 | Kikuchi et al. | |
| 6,835,627 B1 | 12/2004 | Whiston et al. | |
| 2002/0137318 A1 | 9/2002 | Peake et al. | |
| 2003/0059985 A1 * | 3/2003 | Adkisson | H01L 27/0664 438/149 |
| 2005/0145945 A1 * | 7/2005 | Zdebel | H01L 27/0255 257/355 |
| 2006/0118902 A1 | 6/2006 | Ikuta et al. | |
| 2006/0145285 A1 | 7/2006 | Lee | |
| 2007/0090451 A1 | 4/2007 | Lee | |
| 2009/0256176 A1 * | 10/2009 | Kobayashi | H01L 27/14603 257/225 |
| 2011/0175199 A1 * | 7/2011 | Lin | H01L 29/0646 257/605 |
| 2012/0139013 A1 * | 6/2012 | Bahl | H01L 29/7722 257/266 |
| 2012/0175704 A1 | 7/2012 | Jiang | |
| 2013/0270606 A1 * | 10/2013 | Chen | H01L 29/7835 257/183 |
| 2014/0139282 A1 * | 5/2014 | Yeh | H01L 29/404 327/430 |
| 2014/0210002 A1 * | 7/2014 | Sawase | H01L 29/7825 257/334 |
| 2014/0231884 A1 * | 8/2014 | Yeh | H01L 29/404 257/285 |
| 2015/0325639 A1 * | 11/2015 | Liao | H01L 29/41758 327/434 |
| 2015/0380398 A1 * | 12/2015 | Mallikarjunaswamy | H01L 29/7823 257/272 |
| 2016/0240657 A1 * | 8/2016 | Chan | H01L 29/7816 |

FOREIGN PATENT DOCUMENTS

| | | |
|---|---|---|
| CN | 101930926 A | 12/2010 |
| CN | 201910425 U | 7/2011 |

* cited by examiner

HIGH VOLTAGE LDMOS DEVICE WITH AN INCREASED VOLTAGE AT SOURCE (HIGH SIDE) AND A FABRICATING METHOD THEREOF

FIELD OF INVENTION

The present invention relates to an LDMOS (laterally diffused metal oxide semiconductor) device.

BACKGROUND ART

An LDMOS device with an increased voltage at source (high side) refers to one whose source cathode is connected with a voltage, such as connected to a same voltage as that of the drain, which is dramatically different from a typical LDMOS device whose source cathode is grounded.

Reference is made to FIG. 1, where an n type LDMOS device with an increased voltage at source (high side) of prior art is shown. An n type buried layer is situated in a p type substrate, and an n type epitaxial layer is situated above on the n type buried layer. The lateral wall of the n type buried layer is in contact with a ring of a p type buried layer, a first p well is situated above the p type buried layer and has a p heavily doped substrate terminal. The first p well, the p type buried layer and the n type buried layer constitutes a bowl shaped isolating ring which isolated the n type epitaxial layer from the p type substrate. A second p well and an n well is situated in the n type epitaxial layer. On the surface of the second p well an n type heavily doped source region and a p type heavily doped body region terminal are situated. In the n type epitaxial layer and on top of the n well, an n type drift region is situated. On the surface of the n type drift region an n type heavily doped drain is situated. On the surface of the n type epitaxial and the n type drift region multiple isolating structures are situated, for isolating the substrate terminal from the drain or the drain from a gate. A gate and a gate oxide layer are situated on the outer side of the source and on top of the second p well, the n type epitaxial layer and n type drift region. A part of the gate is also situated on top of the isolating structure which is on top of the drift region.

The LDMOS device as shown on FIG. 1 can be fabricated by the BCD (bipolar-CMOS-DMOS) technique, and the manufacturing processes can be 0.35 μm. The breakdown voltage of the LDMOS device is subject to two limitations: the first being the breakdown voltage between the n type buried layer and the p type buried layer in the isolating ring structure, the second being the breakdown voltage between the drain and the source. The LDMOS device, due to the limited thickness (less than 4.5 μm) of the n type epitaxial layer and the n type buried layer under the n type epitaxial layer, is unable to withstand voltage in excess of 70v. Even by increasing the length of the n type drift region, the withstand voltage can only be increased up to 50v. Hence, the LDMOS device can only be employed as a power device with an increased voltage at source (high side) whose withstand voltage is 40V.

SUMMARY

The technical problem the present invention aims to solve is to provide a high voltage LDMOS device with an increased voltage at source (high side) in a new structure, the withstand voltage thereof being increased via an optimized structure.

To solve the afore-mentioned technical problems, a high voltage LDMOS device with an increased voltage at source (high side) of the present invention is surrounded by a bowl shaped isolating ring; said isolating ring comprises an n type buried layer and a p type buried layer and a p well on top of the p type buried layer along the interface between a p type substrate and an n type epitaxial layer; the n type buried layer and the p type buried layer are not in contact with one another, and are distant from one another with a distance, thereby increasing the withstand voltage between the n type buried layer and the p type buried layer; in the vertical direction the p type buried layer partially overlaps with a drain, thereby the p type buried layer exerts a Reduced Surface Field effect on the drain, so as to increase the withstand voltage of the drain against a source; the n type buried layer is located under the bottom center of the source and a out terminal of a body region, and thus the source and the out terminal of the body region are high voltage isolated from the p type substrate.

A fabricating method for the high voltage LDMOS device with an increased voltage at source (high side) of the present invention comprises the following steps:

Step 1: injecting ions into a p type substrate to form an n type injection region;

Step 2: injecting ions into the p type substrate to form a p type injection region; the lateral surfaces of the p type injection region and the n type injection region being not in contact with one another, and being distant with one another with a distance;

Step 3: forming an n type epitaxial layer on top of the p type substrate; transforming the p type injection region to a p type buried layer, and the n type injection region to an n type buried layer; the p type buried layer and the n type buried layer being both situated along the interface between the p type substrate and the n type epitaxial layer;

Step 4: growing a first silicon oxide via thermal oxidation on the surface of the n type epitaxial layer, depositing a silicon nitride, and then removing the silicon nitride and the first silicon oxide at certain positions via photoetching; subsequently growing a second silicon oxide via thermal oxidation on the exposed surface of the n type epitaxial layer as an isolating structure; and finally removing the silicon nitride via wet etching;

Step 5: forming an n well via injecting ions into the n type epitaxial layer;

Step 6: forming an n type drift region on top of the n well;

Step 7: forming a first p well and a second p well in the n type epitaxial layer; wherein the first p well, the p type buried layer and the n type buried layer constituting an isolating ring surrounding the LDMOS;

Step 8: growing a third silicon oxide via thermal oxidation on the n type epitaxial layer, depositing a polysilicon, and subsequently forming a polysilicon gate and a gate oxide layer thereunder;

Step 9: injecting ions for forming a substrate terminal in the first p well, for forming a drain in the drift region, and for forming a source and a body out terminal in the second p well; wherein the drain and the p type buried layer overlaps at least partially in the vertical direction, and the source and the body terminal are centrally on top of the n type buried layer.

The present invention increase the breakdown voltage of the high voltage LDMOS device with an increased voltage at source (high side) via structural optimization and under the same fabricating process and procedure, thus enabling it to be applied in an increased voltage at source (high side) condition an increased voltage at source (high side) with a high withstand voltage.

DETAILED DESCRIPTION

Figure 2:
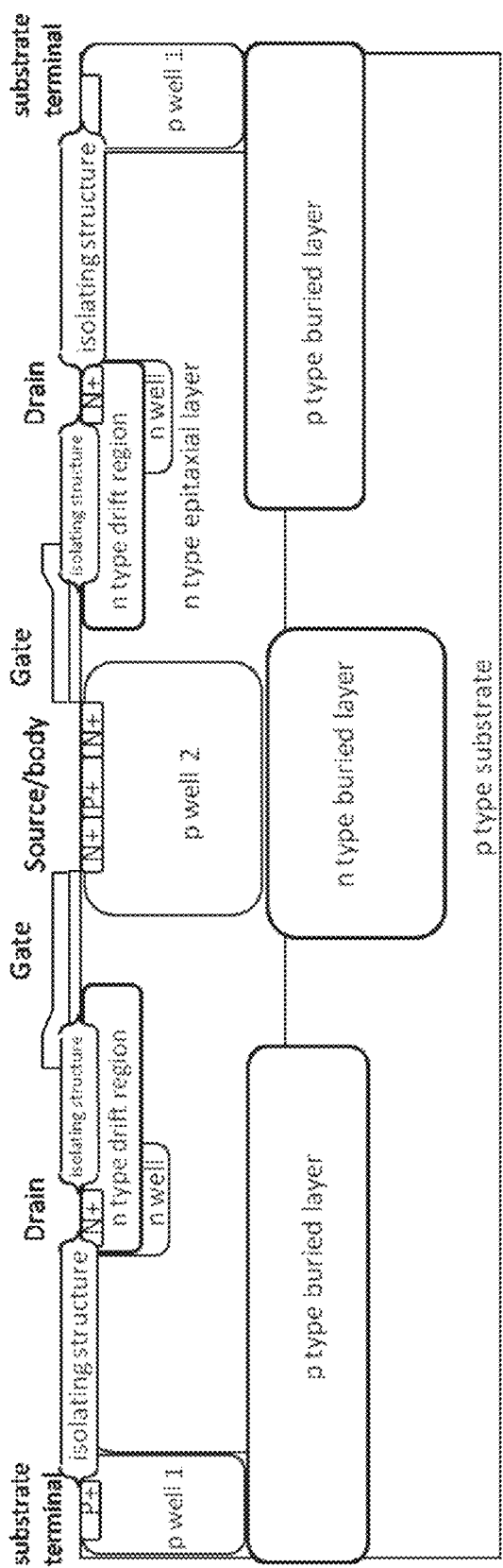
FIG. 2 is a schematic diagram of an n type LDMOS device used in an increased voltage at source (high side) of the present invention.

Reference is made to FIG. 2, which shows an n type LDMOS device used in an increased voltage at source (high side) of the present invention. An n type epitaxial layer is situated in a p type substrate. An n type buried layer and a p type buried layer are situated along the interface between the p type substrate and the n type epitaxial layer. The lateral surfaces of the n type buried layer and the p type buried layer are not in contact with one another, and are distant with a distance from one another. A first p well is situated on top of the p type buried layer, and an out terminal of a p type heavily doped substrate is situated in the first p well. A second p well and an n well are situated in the n type epitaxial layer, wherein the second p well is on central top of the n type buried layer. On the surface of the second p well are situated an n type heavily doped source region and a p type heavily doped out terminal of the body region. In the n type epitaxial layer and on top of the n well is situated an n type drift region. On the surface of the n type drift region is situated an n heavily doped drain. The drain and the p type buried layer overlap at least partially in the vertical direction. Multiple isolating structures are situated either on the surface of the n type epitaxial layer or of the n type drift region, for isolating the out terminal of the substrate from the drain, or the drain from a gate. On a outer side of the source and on top of the second p well, the n type epitaxial layer and the n type drift region are situated a gate oxide and the gate, wherein the gate is partially on top of the isolating structure on the drift region.

In comparison with the n type LDMOS device used in an increased voltage at source (high side) of prior art, the n type LDMOS device with an increased voltage at source (high side) of the present invention is improved in the following aspects:

First, in prior art, the p type buried layer and that of the n type buried layer are in contact with one another on their lateral surfaces and completely isolates n type epitaxial layer from p type substrate. In the present invention, owing to new lay-out design, a lateral surface of the p type buried layer and that of the n type buried layer of the present invention are not in contact with one another, and are distant from one another with a distance, thus increasing the breakdown voltage between the p type buried layer and the n type buried layer.

Second, in consideration of the comparative thinner thickness of the n type epitaxial layer, the present invention overlaps the drain and the p type buried layer in the vertical direction, here the p type buried layer exerts a Resurf (Reduced Surface Field) effect on the drain, thus the withstand voltage between the source and the drain is increase.

Third, the n type buried layer remains on the center bottom of the second p well, which ensuring the high voltage isolation of the source and the body terminal from the p type substrate, so that the LDMOS device can be used as a power device in an increased voltage at source (high side).

Figure 1:
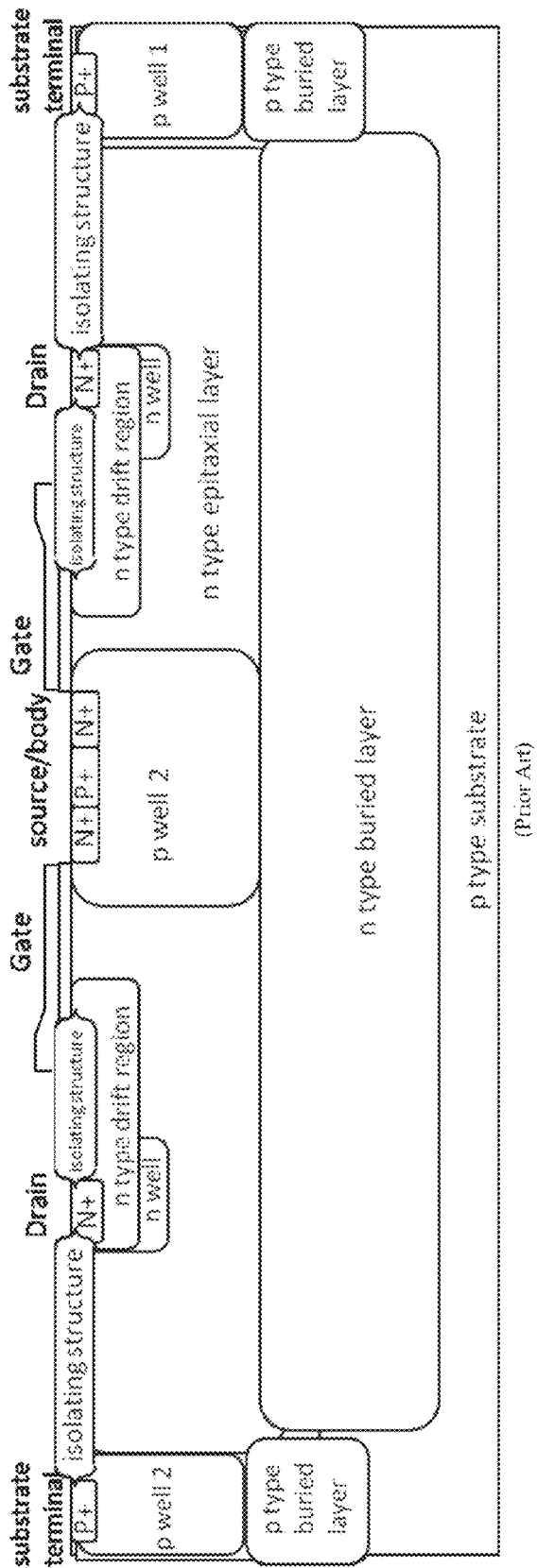
FIG. 1 is a schematic diagram of an n type LDMOS device with an increased voltage at source (high side) of prior art.
Figure 3:
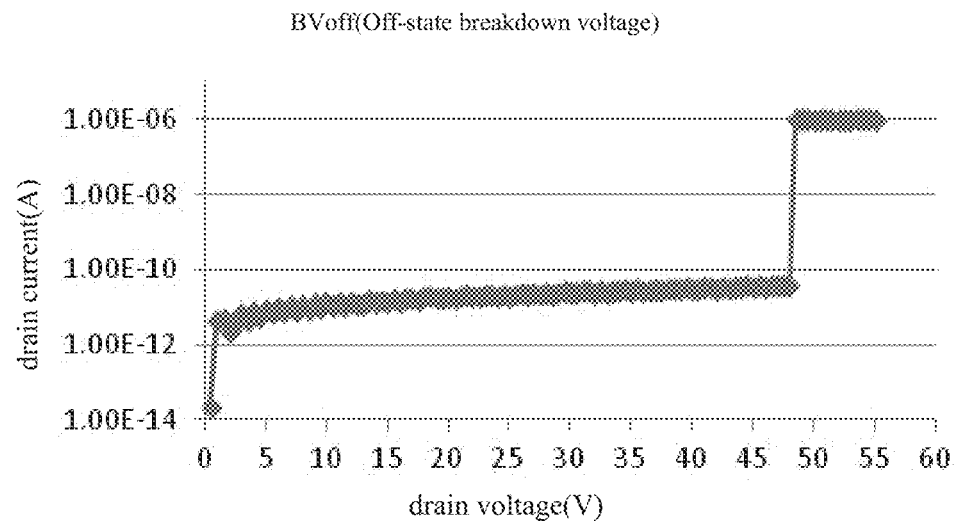
FIG. 3 is a schematic diagram of the BVoff (off-state breakdown voltage) of the n type LDMOS device used Man increased voltage at source (high side) of prior art.
Figure 4:
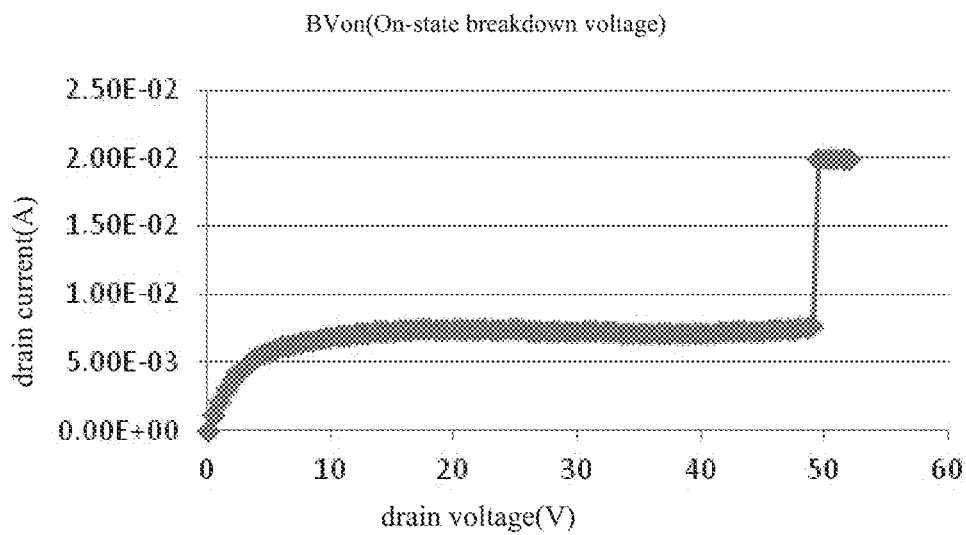
FIG. 4 is a schematic diagram of the BVon (on-state breakdown voltage) of the n type LDMOS device used in an increased voltage at source (high side) of prior art.

Refer to FIG. 3 and FIG. 4, the LDMOS of prior art as shown in FIG. 1 has a BVoff and a BVon respectively of 48v and 50v, which usually can only be used as a 40v withstand voltage power device used in an increased voltage at source (high side).

Figure 5:
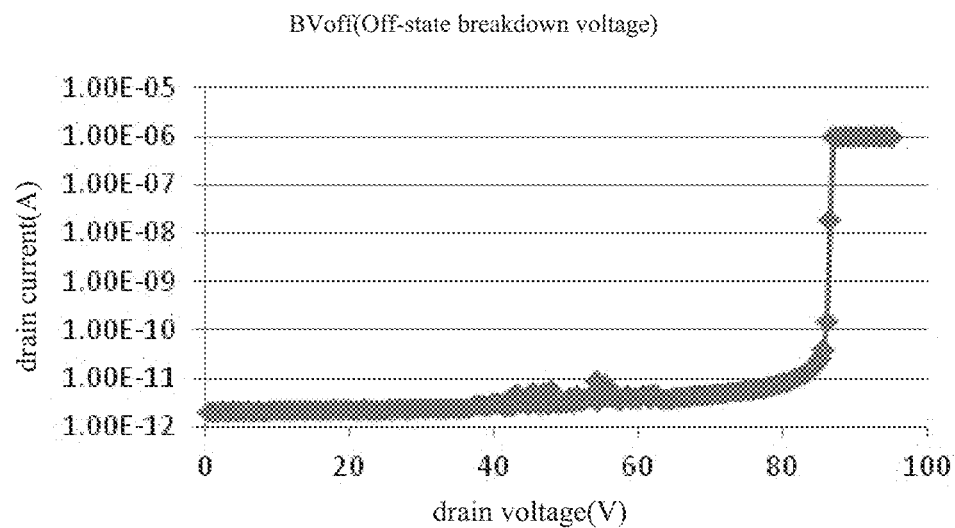
FIG. 5 is a schematic diagram of the BVoff (off-state breakdown voltage) of the n type LDMOS device used in an increased voltage at source (high side) of the present invention.
Figure 6:
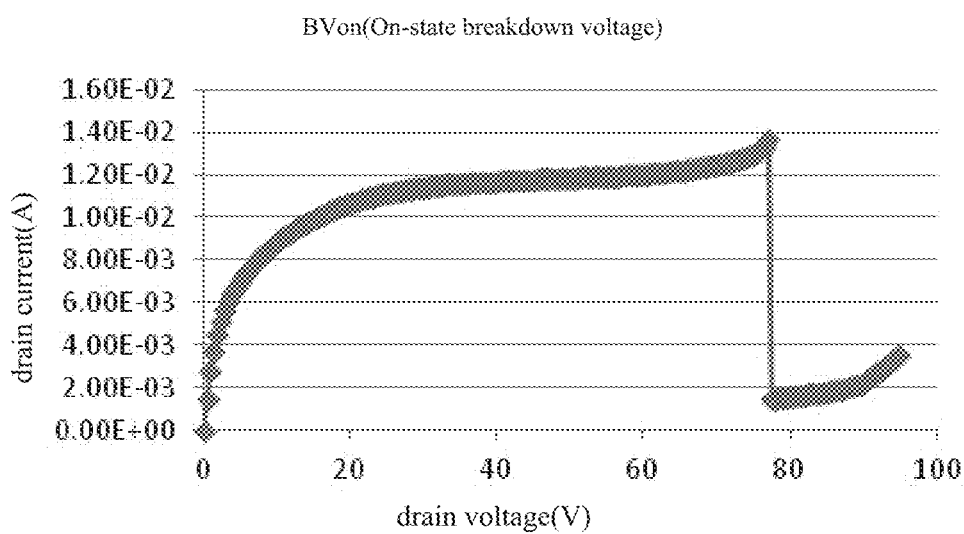
FIG. 6 is a schematic diagram of the BVon (on-state breakdown voltage) of the n type LDMOS device with an increased voltage at source (high side) of the present invention.

Refer to FIG. 5 and FIG. 6, the LDMOS of the present invention as shown on FIG. 2 has a BVoff and a BVon respectively of 85v and 77v, which can be used as a 70v withstand voltage power device in an increased voltage at source (high side).

The LDMOS of the present invention adopts the BCD process and the 3.35 μm procedure of prior art, requires no extra lithography mask, while increases the withstand voltage of the device by more than 60% (77v as compared with 48v), thus substantially extending the scope of the application prospects thereof.

A fabricating method for the high voltage LDMOS device used in an increased voltage at source (high side) of the present invention comprises the following steps:

Step 1: form an n type injection region in a p type substrate by photoetching and ion injection. The n type impurity for ion injection can be antimony (Sb), for example, while a step of high temperature annealing is generally required subsequent to ion injection.

Step 2: form a p type injection region on the p type substrate by photoetching and ion injection. The p type impurity for ion injection can be boron (B), for example, while a step of rapid thermal annealing (RTA) is generally required subsequent to ion injection.

Here, the lateral surfaces of the p type injection region and the n type injection region are not in contact with one another, and are distant from one another with a distance.

Step 3: form an n type epitaxial layer on top of the p type substrate.

Here, the p type injection region is transformed to a p type buried layer, and the n type injection region to an n type buried layer. The p type buried layer and the n type buried layer are both situated along the interface between the p type substrate and the n type epitaxial layer.

Step 4: Grow a silicon oxide (named as the first silicon oxide) by thermal oxidation on the surface of the n type epitaxial layer, deposit a silicon nitride, and remove portions of the silicon nitride and the first silicon oxide by photoetching. Subsequently re-grow a silicon oxide (named as the second silicon oxide) via thermal oxidation on the exposed surface of the n type epitaxial layer as an isolating structure. And finally remove the silicon nitride via wet etching.

Step 5: form an n well in the n type epitaxial layer via photoetching and ion injection. The ion injection can be realized for example in a three steps. That is, divide the n well into an upper, middle and a lower portion; inject ions in the lower portion first, then in the middle portion, and finally in the upper portion.

Step 6: form an n type drift region on top of the n well via photoetching and ion injection. The n type impurity for ion injection can be phosphorus (P), for example.

Step 7: form a first p well and a second p well in the n type epitaxial layer via photoetching and ion injection. Wherein, the ion injection can be realized for example in a three steps. That is, divide the p well into an upper, middle and a lower portion; inject ions in the lower portion first, then the middle portion, and finally the upper portion.

Step 8: grow a silicon oxide (named as the third silicon oxide) via thermal oxidation on the n type epitaxial layer, deposit a polysilicon, and subsequently form a polysilicon gate and a gate oxide layer thereunder.

Here, a portion of the gate is on top of the second p well, the n type epitaxial layer, and the n type drift region, while another portion is on top of the isolating structure on the drift region.

Step 9: form a substrate out terminal in the first p well, a drain in the drift region, and a source and body terminal in the second p well via photo etching and ion injection.

Finally conduct backend process to lead out various electrodes by etching contact holes, filling in metals, connecting wires, and passivation layers.

The above are preferred embodiments of the present invention, which by no means to limit the scope of the present invention. The present invention is subject to variations and modifications by a person of the art without departing from the principles thereof, which shall fall within the scope of the present invention.

What is claimed is:

1. A high voltage LDMOS device with a high side source voltage, the LDMOS device comprises:
    a bowl shaped isolating ring surrounding the LDMOS device;
    the isolating ring comprises an n type buried layer and a p type buried layer along an interface between a p type substrate and an n type epitaxial layer, and a p well on top of the p type buried layer;
    a lateral surface of the n type buried layer and a lateral surface of the p type buried layer are not in contact with one another, and are distant from one another with a distance, thereby withstanding an increased voltage between the n type buried layer and the p type buried layer;
    the p type buried layer and a drain overlap at least partially in a vertical direction, thus enabling the p type buried layer to exert a reduced surface field action on the drain, so as to withstand an increased voltage of the drain against a source; and
    the n type buried layer is in the center bottom of the source and a body terminal, so that the source and the body terminal are high voltage isolated from the p type substrate.

2. The high voltage LDMOS device with the high side source voltage of claim 1, wherein the n type epitaxial layer is situated in the p type substrate; the n type buried layer and the p type buried layer are situated along the interface between the p type substrate and the n type epitaxial layer; the lateral surface of the n type buried layer and the lateral surface of the p type buried layer are not in contact with one another, and are distant from one another with a distance; a first p well is situated on top of the p type buried layer, and a p heavily doped substrate terminal is situated in the first p well; a second p well and an n well is situated in the n type epitaxial layer, wherein the second p well is on central top of the n type epitaxial layer; on a surface of the second p well is situated the source which is n heavily doped and the body terminal which is p heavily doped; in the n type epitaxial layer and on top of the n well is situated an n type drift region; on a surface of the n type drift region is situated the drain which is n type heavily doped; the drain and the p type buried layer overlap at least partially in the vertical direction; on a surface of the n type epitaxial or on the surface of the n type drift region are situated multiple isolating structures, for isolating the substrate terminal from the drain or the drain from a gate; on a lateral side of the source and on top of the second p well, the n type epitaxial layer and the n type drift region are situated a gate oxide and the gate, wherein the gate is also partially on top of the isolating structure on top of the drift region.

3. A fabricating method for the high voltage LDMOS device with the high side source voltage according to claim 1, the method comprising:
    Step 1: injecting ions into a p type substrate to form an n type injection region;
    Step 2: injecting ions into the p type substrate to form a p type injection region; a lateral surface of the p type injection region and a lateral surface of the n type injection region being not in contact with one another, and being distant with one another with a distance;
    Step 3: forming an n type epitaxial layer on top of the p type substrate; transforming the p type injection region to a p type buried layer, and the n type injection region to an n type buried layer; the p type buried layer and the n type buried layer being both situated on an interface between the p type substrate and the n type epitaxial layer;
    Step 4: growing a first silicon oxide via thermal oxidation on a surface of the n type epitaxial layer, depositing a silicon nitride, and removing portions of the silicon nitride and the first silicon oxide via photoetching; subsequently growing a second silicon oxide via thermal oxidation on an exposed surface of the n type epitaxial layer to be an isolating structure; and finally removing the silicon nitride via wet etching;
    Step 5: forming an n well via injecting ions into the n type epitaxial layer;
    Step 6: forming an n type drift region on top of the n well;
    Step 7: forming a first p well and a second p well in the n type epitaxial layer; wherein the first p well, the p type buried layer and the n type buried layer constituting an isolating ring surrounding the LDMOS;
    Step 8: growing a third silicon oxide via thermal oxidation on the n type epitaxial layer, depositing a polysilicon, and subsequently forming a polysilicon gate and a gate oxide layer thereunder;
    Step 9: injecting ions for forming a substrate terminal in the first p well, for forming a drain in the drift region, and for forming a source and a body terminal in the second p well; wherein the drain and the p type buried layer overlaps at least partially in the vertical direction, and the source and the body terminal are centrally on top of the n type buried layer.

4. The fabricating method for the high voltage LDMOS device with the high side source voltage of claim 3, wherein, in Step 1, an n type impurity for the injected ions is antimony, and subsequent to the ion injection is a process of high temperature annealing.

5. The fabricating method for the high voltage LDMOS device with the high side source voltage of claim 3, wherein, in Step 2, a p type impurity for the injected ions is boron, and subsequent to the ion injection is a process of rapid thermal annealing.

6. The fabricating method for the high voltage LDMOS device with the high side source voltage of claim 3, wherein, in Step 5, the ion injection is realized steps comprising, dividing the n well into an upper, middle and a lower portion; injecting ions in the lower portion first, subsequently the middle portion, and finally the upper portion.

7. The fabricating method for the high voltage LDMOS device with the high side source voltage of claim 3, wherein, in Step 6, an n type impurity for the injected ions is phosphorus.

8. The fabricating method for the high voltage LDMOS device with the high side source voltage of claim 3, wherein, in Step 7, the ion injection is realized in steps comprising: dividing the p well into an upper, middle and a lower portion; and injecting ions in the lower portion first, subsequently the middle portion, and finally the upper portion.

9. The fabricating method for the high voltage LDMOS device with the high side source voltage of claim 3, wherein, in Step 8, a portion of the gate is on top of the second p well, the n type epitaxial layer, and the n type drift region, another portion of the gate is on top of the isolating structure on the drift region.

* * * * *